(12) United States Patent
Jin

(10) Patent No.: US 11,594,846 B2
(45) Date of Patent: Feb. 28, 2023

(54) ELECTRICAL CONNECTOR WITH GROUND TERMINAL AND SHIELDING

(71) Applicant: LOTES CO., LTD, Keelung (TW)

(72) Inventor: Zuo Feng Jin, Keelung (TW)

(73) Assignee: LOTES CO., LTD, Keelung (TW)

( * ) Notice: Subject to any disclaimer, the term of this patent is extended or adjusted under 35 U.S.C. 154(b) by 407 days.

(21) Appl. No.: 17/023,644

(22) Filed: Sep. 17, 2020

(65) Prior Publication Data
US 2021/0257787 A1 Aug. 19, 2021

(30) Foreign Application Priority Data

Feb. 17, 2020 (CN) .......................... 202020176426.3
May 7, 2020 (CN) .......................... 202020737115.X

(51) Int. Cl.
*H01R 13/6585* (2011.01)
*H01R 13/6588* (2011.01)
(Continued)

(52) U.S. Cl.
CPC ....... *H01R 13/6585* (2013.01); *H01R 12/714* (2013.01); *H01R 13/2421* (2013.01)

(58) Field of Classification Search
CPC .............. H01R 12/7076; H01R 12/714; H01R 13/2407; H01R 13/2421; H01R 13/6471;
(Continued)

(56) References Cited

U.S. PATENT DOCUMENTS 5,412,440 A * 5/1995 Takeda ..................... G02C 1/02
351/110
5,819,391 A * 10/1998 Matsushima ...... A44B 18/0003
24/442
(Continued)

FOREIGN PATENT DOCUMENTS

| CN | 101512745 B | 4/2011 |
| CN | 101884139 B | 3/2015 |
| CN | 107221774 A | 9/2017 |

*Primary Examiner* — Hae Moon Hyeon
*Assistant Examiner* — Thang H Nguyen
(74) *Attorney, Agent, or Firm* — Locke Lord LLP; Tim Tingkang Xia, Esq.

(57) ABSTRACT

An electrical connector is used to be electrically connected to a mating component. The electrical connector includes one or more shielding members, forming multiple receiving holes; and multiple terminals, including at least one signal terminal and at least one ground terminal correspondingly accommodated in the receiving holes. The ground terminal has a mating portion upward abutting the mating component, an elastic portion pressed vertically to elastically deform, and a positioning portion having a cross-section in a circular shape. The positioning portion and the shielding members are conductively connected to each other by at least three conductive portions, and the three conductive portions are provided to form a triangle. An insulating block is between the signal terminal and a corresponding shielding member to be accommodated in a corresponding receiving hole. The positioning portion with a circular cross-section has a larger area when the volume of the receiving hole remains unchanged.

20 Claims, 13 Drawing Sheets

(51) Int. Cl.
*H01R 12/52* (2011.01)
*H01R 12/71* (2011.01)
*H01R 13/24* (2006.01)

(58) Field of Classification Search
CPC ............ H01R 13/6585; H01R 13/6588; H05K 7/1069
See application file for complete search history.

(56) References Cited

U.S. PATENT DOCUMENTS

| | | | |
|---|---|---|---|
| 6,102,627 A * | 8/2000 | Ueda ...................... | E02D 27/34 52/167.9 |
| 6,877,223 B2 * | 4/2005 | Figueroa ............ | H01R 13/6585 439/607.05 |
| 2007/0289773 A1 * | 12/2007 | Caletka ................ | H05K 1/0219 174/262 |
| 2008/0142258 A1 * | 6/2008 | Caletka ................ | H05K 1/0219 174/266 |
| 2008/0160815 A1 * | 7/2008 | Ju ........................ | H05K 7/1061 439/331 |
| 2018/0375262 A1 * | 12/2018 | Ju ......................... | H01R 12/57 |
| 2020/0295489 A1 * | 9/2020 | Chen .................... | H01R 12/57 |
| 2021/0305754 A1 * | 9/2021 | Ho ...................... | H01R 12/7082 |

* cited by examiner

ELECTRICAL CONNECTOR WITH GROUND TERMINAL AND SHIELDING

CROSS-REFERENCE TO RELATED PATENT APPLICATION

This non-provisional application claims priority to and the benefit of, pursuant to 35 U.S.C. § 119(a), patent application Serial No. CN202020176426.3 filed in China on Feb. 17, 2020, and patent application Serial No. CN202020737115.X filed in China on May 7, 2020. The disclosures of the above applications are incorporated herein in their entireties by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to an electrical connector, and particularly to an electrical connector having a shielding member.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

An existing electrical connector is used to be mated with a chip module, and includes: a plurality of shielding members, forming a plurality of receiving holes, where an insulating block is provided in each of the receiving holes; and a plurality of terminals, including a plurality of signal terminals and a plurality of ground terminals, correspondingly accommodated in the receiving holes and positioned in the insulating blocks. Each shielding member is provided with a conductive portion abutting a corresponding ground terminal.

Each of the terminals is formed by bending a metal plate material which is flat plate shaped. Since the volume of each receiving hole is limited, the width of the corresponding terminal cannot be provided to be large due to limited space, and less path is provided in the corresponding terminal for current transmission. Further, each shielding member is only provided with one conductive portion corresponding to each ground terminal, and a gap may exist between the conductive portion and the corresponding ground terminal, such that the corresponding ground terminal cannot be in stable contact with the conductive portion. Moreover, each shielding member is only provided with one conductive portion corresponding to each ground terminal, and the conductive portion provides only a force in one direction to the corresponding ground terminal, thus requiring a corresponding position limiting portion in the insulating block to fix the corresponding ground terminal, such that the corresponding ground terminal does not easily rock or deviate in a shaking environment, thereby increasing the difficulty of the assembly of the ground terminals.

Therefore, a heretofore unaddressed need to design an improved electrical connector exists in the art to address the aforementioned deficiencies and inadequacies.

SUMMARY

In view of the deficiency in the background, the present invention is directed to an electrical connector, in which a positioning portion having a circular cross-section is provided, such that the positioning portion has a larger area without changing the volume of the corresponding receiving hole, thereby having more paths for current transmission, and by providing three conductive portions to form a triangle, the diameter of the positioning portion having the circular cross-section can be ensured, thus allowing the ground terminal to be in stable contact with the conductive portions, and simultaneously facilitating fixing of the ground terminal.

To achieve the foregoing objective, the present invention adopts the following technical solutions. An electrical connector is configured to be electrically connected to a mating component. The electrical connector includes: one or more shielding members, forming a plurality of receiving holes; and a plurality of terminals, comprising at least one signal terminal and at least one ground terminal, correspondingly accommodated in the receiving holes, the ground terminal has a mating portion configured to upward abut the mating component, an elastic portion pressed vertically to elastically deform, and a positioning portion having a circular cross-section, the positioning portion and the shielding member are conductively connected to each other by at least three conductive portions, and the three conductive portions are provided to form a triangle.

In certain embodiments, viewing downward from top thereof, each of the receiving holes is in a square shape, and the at least three conductive portions comprise four conductive portions provided on the positioning portion and tangent to a corresponding one of the receiving holes.

In certain embodiments, the at least three conductive portions and the one or more shielding members are individually formed from the ground terminal, each of the at least three conductive portions has a main body portion and a first contact portion and a second contact portion extending from two ends of the main body portion, the first contact portion abuts the one or more shielding members, the second contact portion abuts the positioning portion, and each of the first contact portion and the second contact portion is provided to form an included angle with the main body portion.

In certain embodiments, the first contact portion is soldered to an inner wall of the corresponding one of the receiving holes, the main body portion is formed by extending downward from the first contact portion, and the second contact portion is formed by extending downward from the main body portion.

In certain embodiments, an insulating block is provided between the ground terminal and a corresponding shielding member of the one or more shielding members to be accommodated in a corresponding one of the receiving holes, the insulating block is provided with an accommodating space for one of the at least three conductive portions to enter, the mating portion is a hollow spherical cap, the elastic portion is a cylinder and is formed by extending downward from a bottom surface of the mating portion, a diameter of the bottom surface of the mating portion is greater than a diameter of the elastic portion, the bottom surface of the mating portion is downward stopped by the insulating block, and the positioning portion is formed by extending downward from the elastic portion.

In certain embodiments, the mating portion, the elastic portion and the positioning portion are all hollow, a side surface of the elastic portion has a screw-shaped notch, the positioning portion is a cylinder having a diameter equal to the diameter of the elastic portion, and a center of the elastic portion, a center of the mating portion and a center of the positioning portion are aligned in a vertical direction.

In certain embodiments, the mating portion, the elastic portion and the positioning portion are individually formed, the mating portion is a hollow spherical cap, the elastic portion is a screw spring, an extending portion is formed by extending downward from the mating portion, a stopping portion is formed by extending downward from the extending portion, the extending portion is a cylinder, a side surface of the stopping portion protrudes out of a side surface of the extending portion, the elastic portion upward abuts the stopping portion, the stopping portion and the elastic portion are accommodated in the positioning portion, the stopping portion is stopped upward by the positioning portion, and the extending portion extends out of the positioning portion.

In certain embodiments, an insulating block is provided between the signal terminal and a corresponding shielding member of the one or more shielding members to be accommodated in a corresponding one of the receiving holes, a buffer space is provided between the insulating block and the corresponding shielding member, and when the corresponding shielding member abuts the ground terminal, the buffer space is reserved for the corresponding shielding member.

In certain embodiments, the electrical connector includes a plurality of shielding members and further includes an insulating body, wherein an insulating block is provided between the signal terminal and one of the shielding members to be accommodated in a corresponding one of the receiving holes, the insulating block is formed by extending upward from the insulating body, the shielding members are engaged perpendicularly to one another to form the receiving holes, and the shielding members are engaged to the insulating body.

In certain embodiments, an insulating block is provided between the signal terminal and a corresponding shielding member of the shielding members to be accommodated in a corresponding one of the receiving holes, an insulating body is located below the one or more shielding members, the insulating block is formed by extending upward from the insulating body, and each of the one or more shielding members is made of an electrically conductive plastic.

An electrical connector is configured to be electrically connected to a mating component. The electrical connector includes: one or more shielding members, forming a plurality of receiving holes; and a plurality of terminals, comprising at least one signal terminal and at least one ground terminal, correspondingly accommodated in the receiving holes, the ground terminal has a mating portion having a circular cross-section configured to upward abut the mating component, an elastic portion pressed vertically to elastically deform, and a positioning portion having a circular cross-section, the positioning portion and the one or more shielding members are conductively connected to each other by at least one conductive portion, and an insulating block is provided between the signal terminal and a corresponding shielding member of the one or more shielding members to be accommodated in a corresponding one of the receiving holes.

In certain embodiments, viewing downward from top thereof, each of the receiving holes is in a square shape, and the at least three conductive portions comprise four conductive portions provided on the positioning portion and tangent to the corresponding one of the receiving holes.

In certain embodiments, four corners of the insulating block abut four corners of the corresponding one of the receiving holes, and a buffer space is provided between a side surface between two adjacent ones of the four corners of the insulating block and the adjacent corresponding shielding member.

In certain embodiments, the at least one conductive portion and the one or more shielding members are individually formed from the ground terminal, each of the at least one conductive portion has a main body portion and a first contact portion and a second contact portion extending from two ends of the main body portion, the first contact portion abuts the one or more shielding members, the second contact portion abuts the positioning portion, and each of the first contact portion and the second contact portion is provided to form an included angle with the main body portion.

In certain embodiments, the first contact portion is soldered to an inner wall of the corresponding one of the receiving holes, the main body portion is formed by extending downward from the first contact portion, and the second contact portion is formed by extending downward from the main body portion.

In certain embodiments, another insulating block is provided between the ground terminal and the corresponding shielding member of the one or more shielding members to be accommodated in another corresponding one of the receiving holes, the insulating block between the ground terminal and the corresponding shielding member is provided with an accommodating space for one of the at least one conductive portion to enter, the mating portion is a hollow spherical cap, the elastic portion is a cylinder with a side surface having a plurality of notches and is formed by extending downward from a bottom surface of the mating portion, a diameter of the bottom surface of the mating portion is greater than a diameter of the elastic portion, the bottom surface of the mating portion is downward stopped by the insulating block between the ground terminal and the corresponding shielding member, and the positioning portion is formed by extending downward from the elastic portion.

In certain embodiments, the mating portion, the elastic portion and the positioning portion are individually formed, the mating portion is a hollow spherical cap, the elastic portion is a screw spring, an extending portion is formed by extending downward from the mating portion, a stopping portion is formed by extending downward from the extending portion, the extending portion is a cylinder, a side surface of the stopping portion protrudes out of a side surface of the extending portion, the elastic portion upward abuts the stopping portion, the stopping portion and the elastic portion are accommodated in the positioning portion, the stopping portion is stopped upward by the positioning portion, and the extending portion extends out of the positioning portion. In certain embodiments, the electrical connector includes a plurality of shielding members and further includes an insulating body, wherein the insulating block is formed by extending upward from the insulating body, the shielding members are engaged perpendicularly to one another to form the receiving holes, and the shielding members are engaged to the insulating body.

In certain embodiments, the electrical connector further includes an insulating body located below the one or more shielding members, wherein the insulating block is formed by extending upward from the insulating body, and each of the one or more shielding members is made of an electrically conductive plastic.

In certain embodiments, the positioning portion and the one or more shielding members are conductively connected to each other by at least three conductive portions, and the three conductive portions are provided to form a triangle.

Compared with the related art, certain embodiments of the present invention have the following beneficial effects: on the premise that the volume of each of the receiving holes remains unchanged, the positioning portion having a circular cross-section may fully utilize the space therein, and may be provided with a larger area and having more paths for current transmission. Further, since the cross-section of the positioning portion is circular, the positioning portion of the ground terminal and the shielding member may be conductively connected to each other by the three conductive portion forming a triangle, and according to the rule that a circle can be determined by three points, the three conductive portions may ensure the diameter of the positioning portion, thus positioning the positioning portion of the ground terminal, and thereby forming effective grounding. Moreover, the three conductive portions provide forces in three different directions, thus allowing the ground terminal to be in stable contact with the three conductive portions, and simultaneously facilitating fixing of the ground terminal.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1:
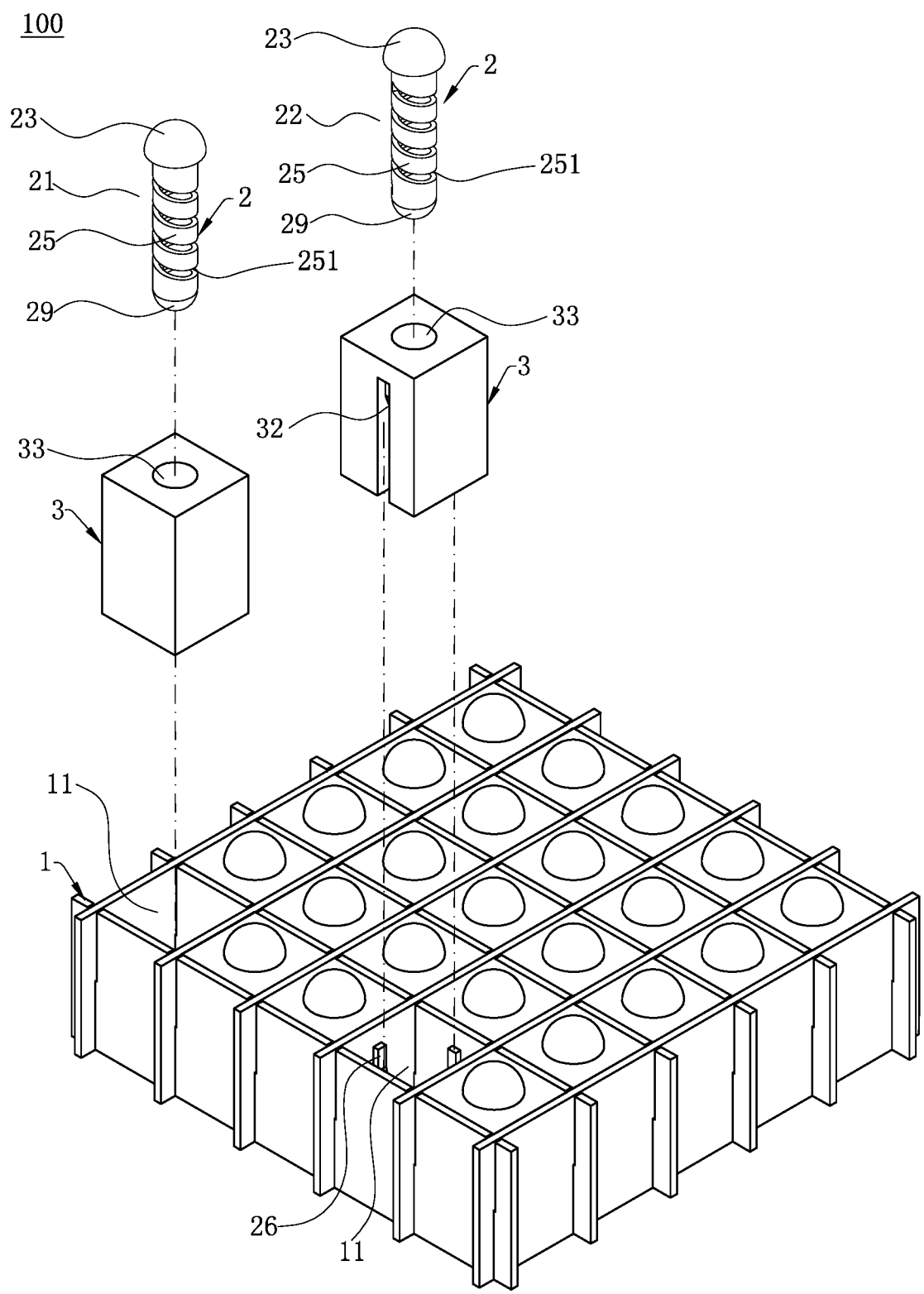
FIG. 1 is a partial exploded view of an electrical connector according to a first embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-13. In accordance with the purposes of this invention, as embodied and broadly described herein, this invention, in one aspect, relates to an electrical connector.

An electrical connector 100 according to certain embodiments of the present invention includes a plurality of shielding members 1 and a plurality of terminals accommodated in a plurality of receiving holes 11 formed by the shielding members 1. In certain embodiments, there can be only one shielding member 1, and the shielding member 1 forms a plurality of receiving holes 11. The electrical connector 100 is used to be electrically connected to a mating component 5 and a circuit board (not shown, same below), and the mating component 5 can be a chip module or other components.

Figure 2:
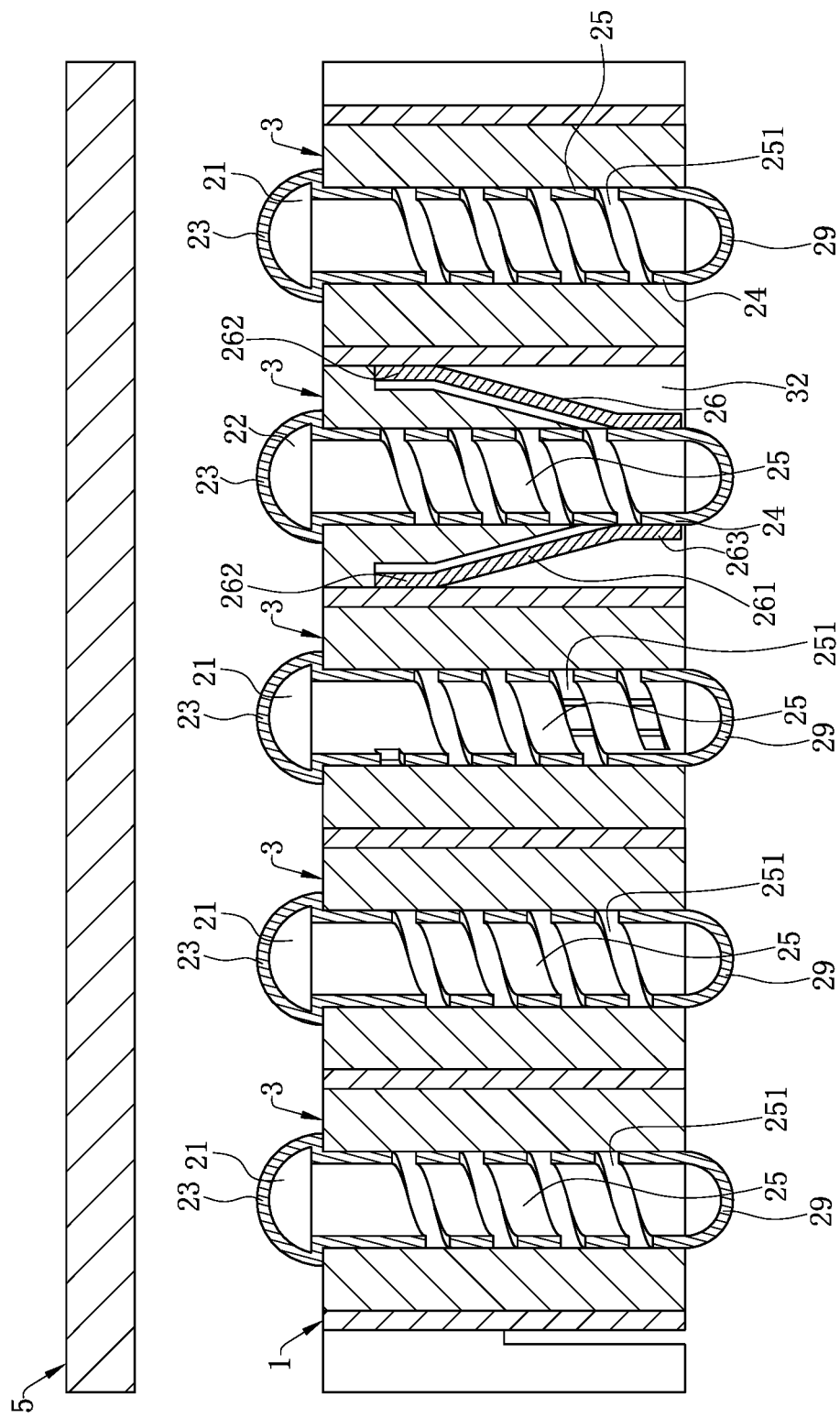
FIG. 2 is a sectional view of the electrical connector according to the first embodiment of the present invention.
Figure 3:
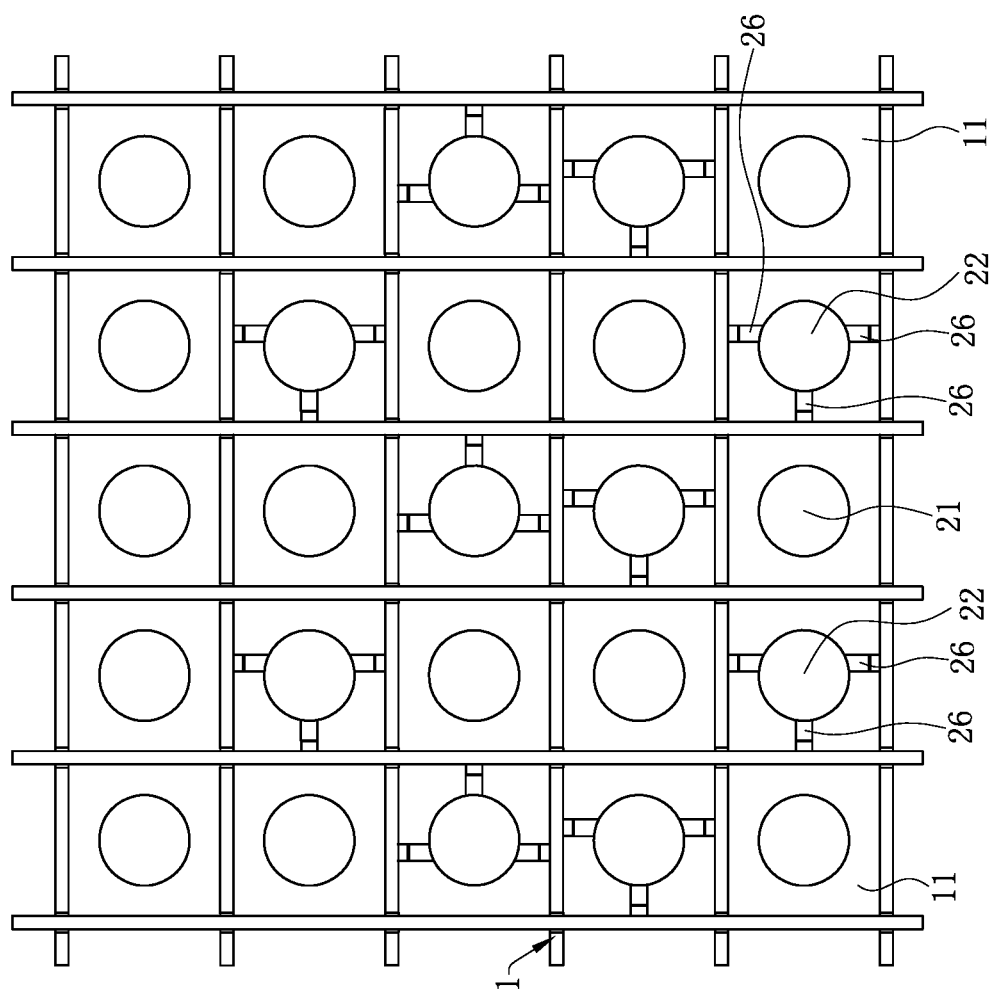
FIG. 3 is a top view of the electrical connector according to the first embodiment of the present invention removing the insulating block.

FIG. 1 to FIG. 3 show an electrical connector 100 according to a first embodiment of the present invention, having a plurality of shielding members 1. The shielding members 1 are all plate shaped. In other embodiments, the shielding members 1 can be in other shapes, such as tube shapes or honeycomb shapes, etc. The shielding members 1 are perpendicular to one another to form a plurality of receiving holes 11. In other embodiments, the receiving holes 11 may also be formed by one shielding member 1 (such as forming a shielding member 1 having a plurality of receiving holes 11 by metal powder pressure casting, or cast forming a shielding members 1 having a plurality of receiving holes 11 by pouring molten a metal material into a mold). Each of the receiving holes 11 has an insulating block 3 therein. One of the terminals 2 is correspondingly accommodated in a corresponding receiving hole 11 and is positioned in a corresponding insulating block 3. It is also possible that a receiving hole 11 may accommodate multiple terminals 2. In this case, the insulating blocks 3 may be changed to be compatible to the quantity of the terminals 2 (such as increasing the quantity of the insulating blocks 3), and a receiving hole 11 may accommodate multiple insulating blocks 3.

As shown in FIG. 1 and FIG. 2, each of the terminals 2 has a mating portion 23 located at a top portion thereof and used to upward abut the mating component 5, an elastic portion 25 pressed vertically to elastically deform, a positioning portion 24 having a circular cross-section, and an abutting portion 29 downward abutting the circuit board. The mating portion 23, the elastic portion 25, the positioning portion 24 and the abutting portion 29 are all hollow. The mating portion 23 is a hollow spherical cap. The elastic portion 25 is a cylinder. The elastic portion 25 may be formed by metal cutting or punching a metal plate material and then curling. A side surface of the elastic portion 25 has a screw-shaped notch 251 formed by cylinder cutting or punching, and an elastic force is provided by pressing the notch 251. The abutting portion 29 is a hollow spherical cap. The mating portion 23, the elastic portion 25, the positioning portion 24 and the abutting portion 29 are integrally formed. The elastic portion 25 is formed by extending downward from a bottom surface of the mating portion 23. The positioning portion 24 is formed by extending downward from the elastic portion 25. The abutting portion 29 is formed by extending downward from the positioning portion 24. A diameter of the bottom surface of the mating portion 23 is greater than a diameter of the elastic portion 25. The positioning portion 24 is a cylinder having a diameter equal to the diameter of the elastic portion 25. A diameter of a top surface of the abutting portion 29 is equal to the diameter of the positioning portion 24. In a vertical direction, a center of the elastic portion 25, a center of the mating portion 23, a center of the positioning portion 24 and a center of the abutting portion 29 are aligned. When the mating component 5 presses downward onto the mating portion 23, and the abutting portion 29 downward abuts the circuit board, the force applied to the terminal 2 is balanced. The bottom surface of the mating portion 23 is downward stopped by the corresponding insulating block 3, ensuring the terminal 2 to be better positioned in the corresponding insulating block 3 and the mating portion 23 to stably abut the mating component 5 simultaneously. On the premise that the volume of each receiving hole 11 remains unchanged, the positioning portion 24 being a cylinder may fully utilize the space therein compared to a positioning portion 24 being a flat plane structure, and may be provided with a larger area and having more paths for current transmission.

As shown in FIG. 1 to FIG. 3, the terminals 2 include a plurality of signal terminals 21 and a plurality of ground terminals 22. The shapes and sizes of the signal terminals 21 and the ground terminals 22 are identical. Each of the signal terminals 21 may be a single-ended signal terminal 21, or may be a differential signal terminal 21. Each of the ground terminals 22 and the corresponding shielding member 1 are conductively connected to each other through three conductive portions 26. The three conductive portions 26 are provided to form a triangle. The three conductive portions 26, the corresponding shielding member 1 and the corresponding ground terminal 22 are individually formed, such that the effect of the elastic deformation of the three conductive portions 26 to the corresponding ground terminal 22 and the corresponding shielding member 1 is relatively small, the electrical connector 100 is more stable as a whole, and the ground terminal 22 may be more stably fixed to the corresponding insulating block 3 by adjusting the three conductive portions 26. Each of the three conductive portions 26 has a main body portion 261 and a first contact portion 262 and a second contact portion 263 extending from two ends of the main body portion 261. The first contact portion 262 abuts the corresponding shielding member 1, and the second contact portion 263 abuts the positioning portion 24. Each of the first contact portion 262 and the second contact portion 263 is provided to form an included angle with the main body portion 261, allowing the three conductive portions 26 to stably abut the corresponding shielding member 1 and the positioning portion 24. Specifically, the first contact portion 262 is soldered to an inner wall of the corresponding receiving hole 11, and the structures of the conductive portions 26 are more stable. The main body portion 261 is formed by extending downward from the first contact portion 262, and the second contact portion 263 is formed by extending downward from the main body portion 261.

As shown in FIG. 1 to FIG. 3, corresponding to the three conductive portions 26, the insulating block 3 positioning the corresponding ground terminal 22 is provided with an accommodating space 32. The accommodating space 32 is concavely provided on a lower end of the insulating block 3, allowing the three conductive portions 26 to be assembled and enter the accommodating space 32 upward from bottom thereof, and a width of the accommodating space 32 is equal to a width of each of the conductive portions 26, which may limit the left-right deviation of the three conductive portions 26, such that the volume of the accommodating space 32 is relatively small, and the effect of the insulating block 3 fixing the corresponding ground terminal 22 is relatively small. The ground terminal 22 is conductively connected to the corresponding shielding member 1 by the three conductive portions 26 in three directions, ensuring the electrical connection between the ground terminal 22 and the corresponding shielding member 1, and thereby ensuring effective grounding.

As shown in FIG. 1 to FIG. 3, three conductive portions 26 are provided between each ground terminal 22 and the corresponding shielding member 1, and the ground terminal 22 may be in stable contact with the three conductive portions 26. According to the rule that a circle can be determined by three points, the three conductive portions 26 may ensure the contour of the positioning portion 24 being a cylinder, and may ensure the diameter of the positioning portion 24. To better fix the terminal 2 such that it does not easily rock or deviate in a shaking environment, the insulating block 3 having a through hole 33 with a diameter equal to the diameter of the positioning portion 24 may be formed to fix the terminal 2. Further, the diameter of the mating portion 23 is greater than the diameter of the elastic portion 25, and the diameter of the positioning portion 24 is equal to the diameter of the elastic portion 25. Thus, the elastic portion 25 and the positioning portion 24 may both enter the through hole 33 of the corresponding insulating block 3, but the mating portion 23 may be engaged outside the corresponding insulating block 3, such that the terminal 2 is stably positioned in the corresponding insulating block 3.

Figure 4:
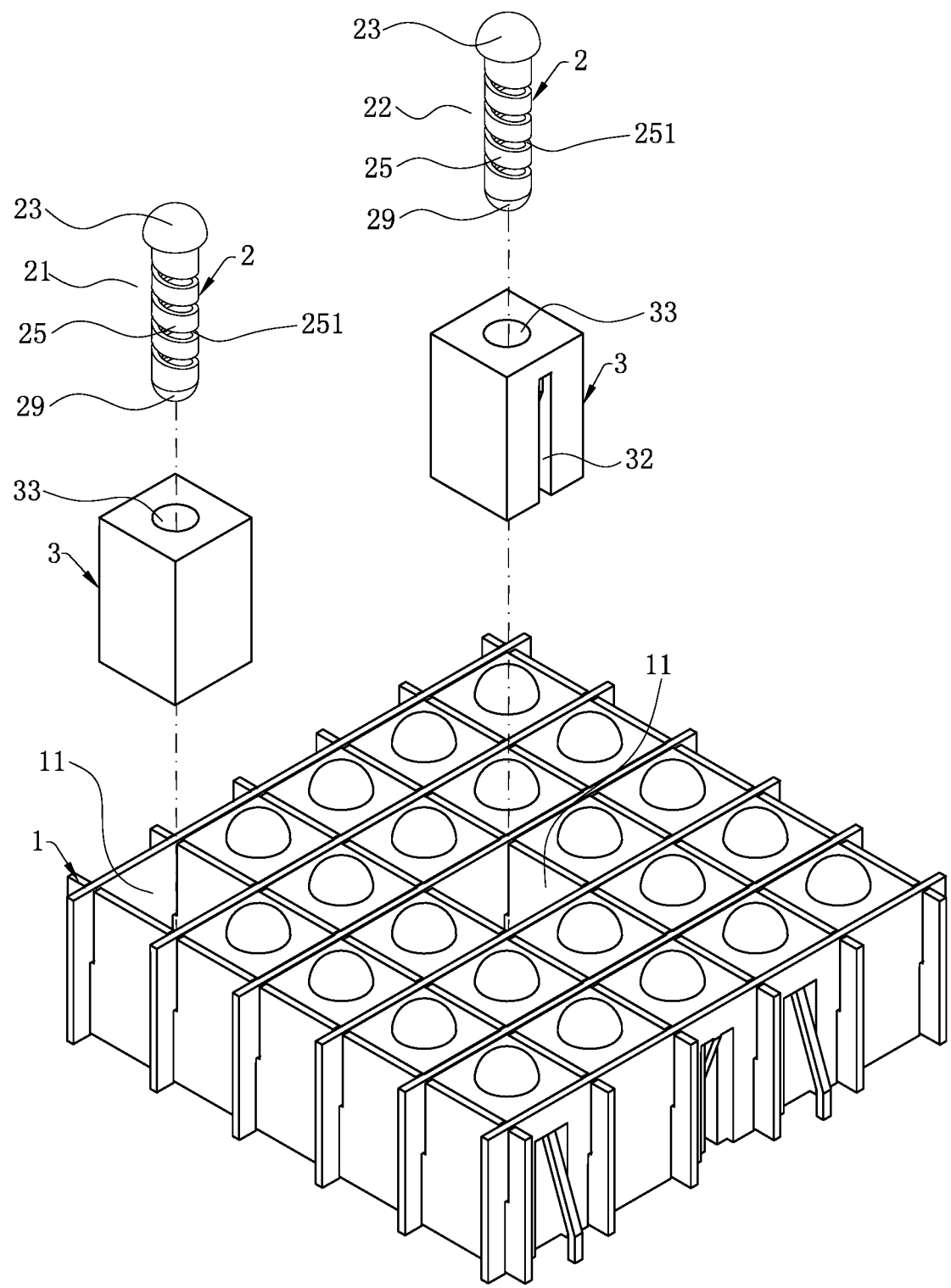
FIG. 4 is a partial exploded view of an electrical connector according to a second embodiment of the present invention.
Figure 5:
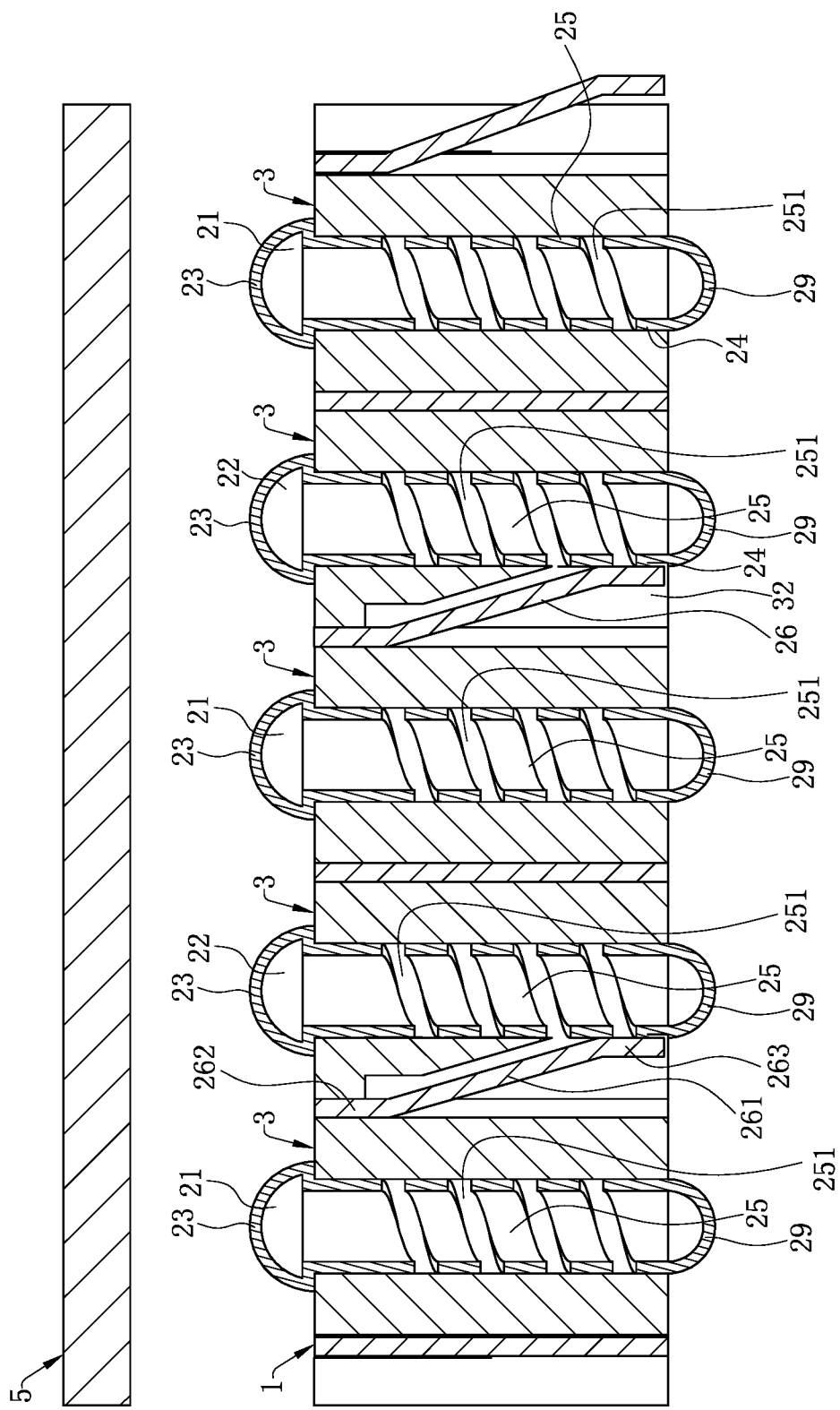
FIG. 5 is a sectional view of the electrical connector according to the second embodiment of the present invention.
Figure 6:
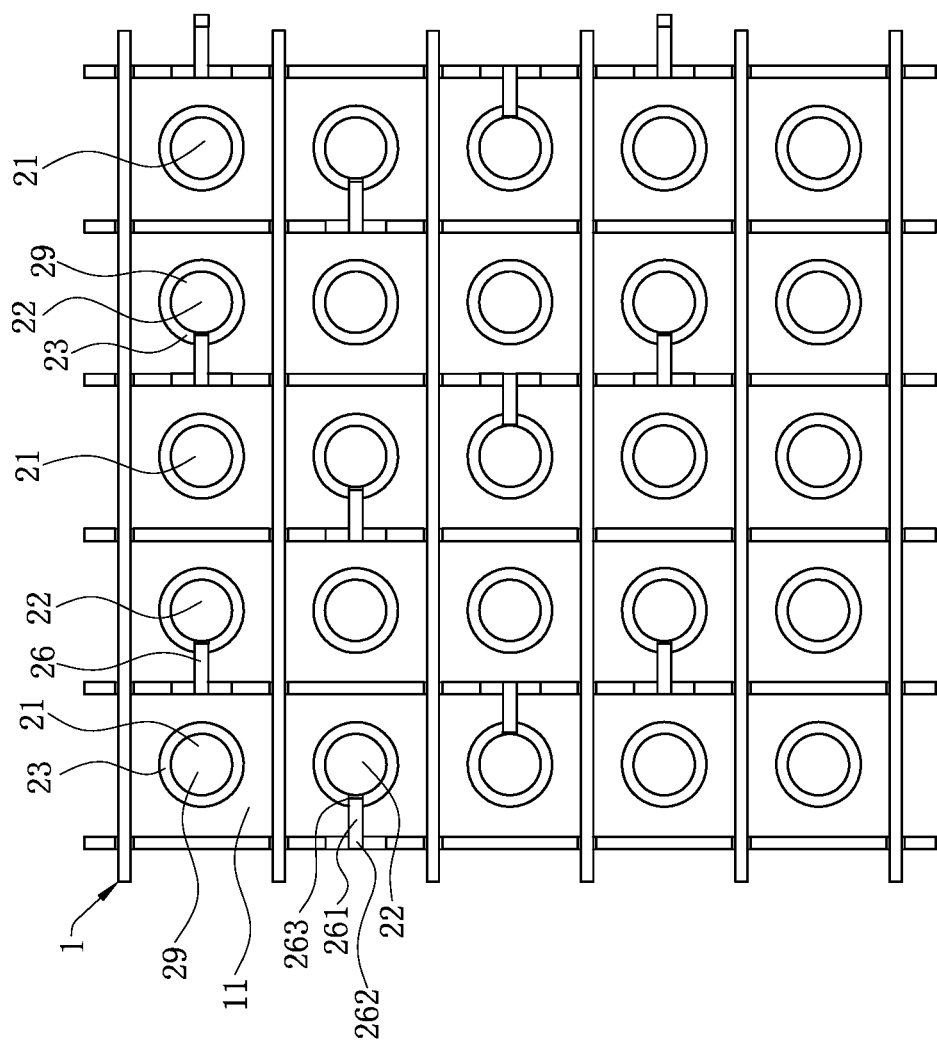
FIG. 6 is a bottom view of the electrical connector according to the second embodiment of the present invention removing the insulating block.

FIG. 4 to FIG. 6 show an electrical connector 100 according to a second embodiment of the present invention, which is different from the first embodiment in that: only one conductive portion 26 is provided between each ground terminal 22 and the corresponding shielding member 1, thus saving the material of the conductive portion 26. Further, the conductive portion 26 is integrally formed on the corresponding shielding member 1, facilitating saving the material and reducing the cost, and reducing the assembling steps and the assembling difficulty. Other structures and functions of the present embodiment are identical to those of the first embodiment, and are thus not further elaborated herein.

According to the "skin effect," when a conductor has an alternate current or an alternate electromagnetic field therein, the current distribution in the conductor is not even, and the current is integrated at the "skin" of the conductor. That is, the current is integrated on a thin layer of the outer surface of the conductor. The current density becomes greater when it is closer to the surface of the conductor, and the current inside the conductor is relatively small, resulting in the resistance of the conductor to increase, and the loss of power also increases. In a high frequency circuit, the current change rate is large, and the uneven distribution status is serious. The magnetic field generated by the high frequency current in the conductor induces the greatest electromotive force in a center region of the conductor. Since the induced electromotive force generates an induced current in a closed circuit, the induced current is the greatest in the center of the conductor, as the induced current is always in the direction reducing the original current, which forces the current to be limited to the location close to the outer surface of the conductor. Referring to FIG. 2, in the present embodiment, the mating portion 23 is a hollow spherical cap, and the elastic portion 25 is a hollow cylinder, such that the current may integrate on the surfaces of the mating portion 23 and the elastic portion 25, greatly reducing the loss in the current transmission process, and facilitating the transmission of high frequency currents.

As shown in FIG. 3 and FIG. 6, a ground terminal 22 is provided around each of the signal terminals 21, and three signal terminals 21 are provided around each of the ground terminals 22. Each ground terminal 22 is electrically connected to the corresponding shielding member 1 by the conductive portion 26, ensuring effective grounding, and providing a more effective current returning path for the signals, thereby reducing the loop inductance of the electrical connector 100, facilitating reducing the crosstalk between the signal terminals 21 and transmission of high frequency signals. Further, the quantity of the ground terminals 22 is less than the quantity of the signal terminals 21 all the time, facilitating control of the impedance of the electrical connector 100 and reducing the crosstalk, and satisfying the input/output requirement of the electrical connector 100.

Figure 7:
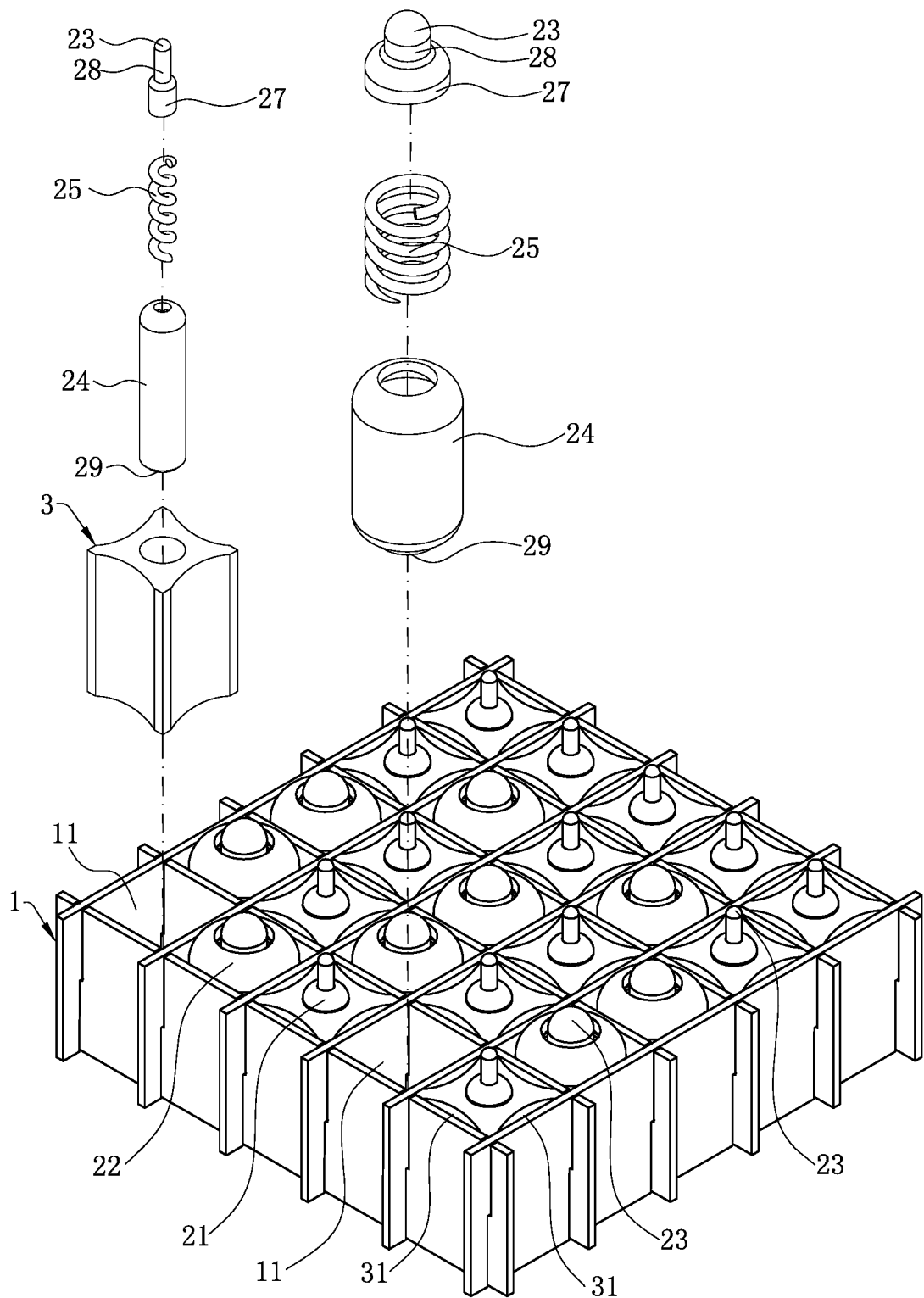
FIG. 7 is a partial exploded view of an electrical connector according to a third embodiment of the present invention.
Figure 8:
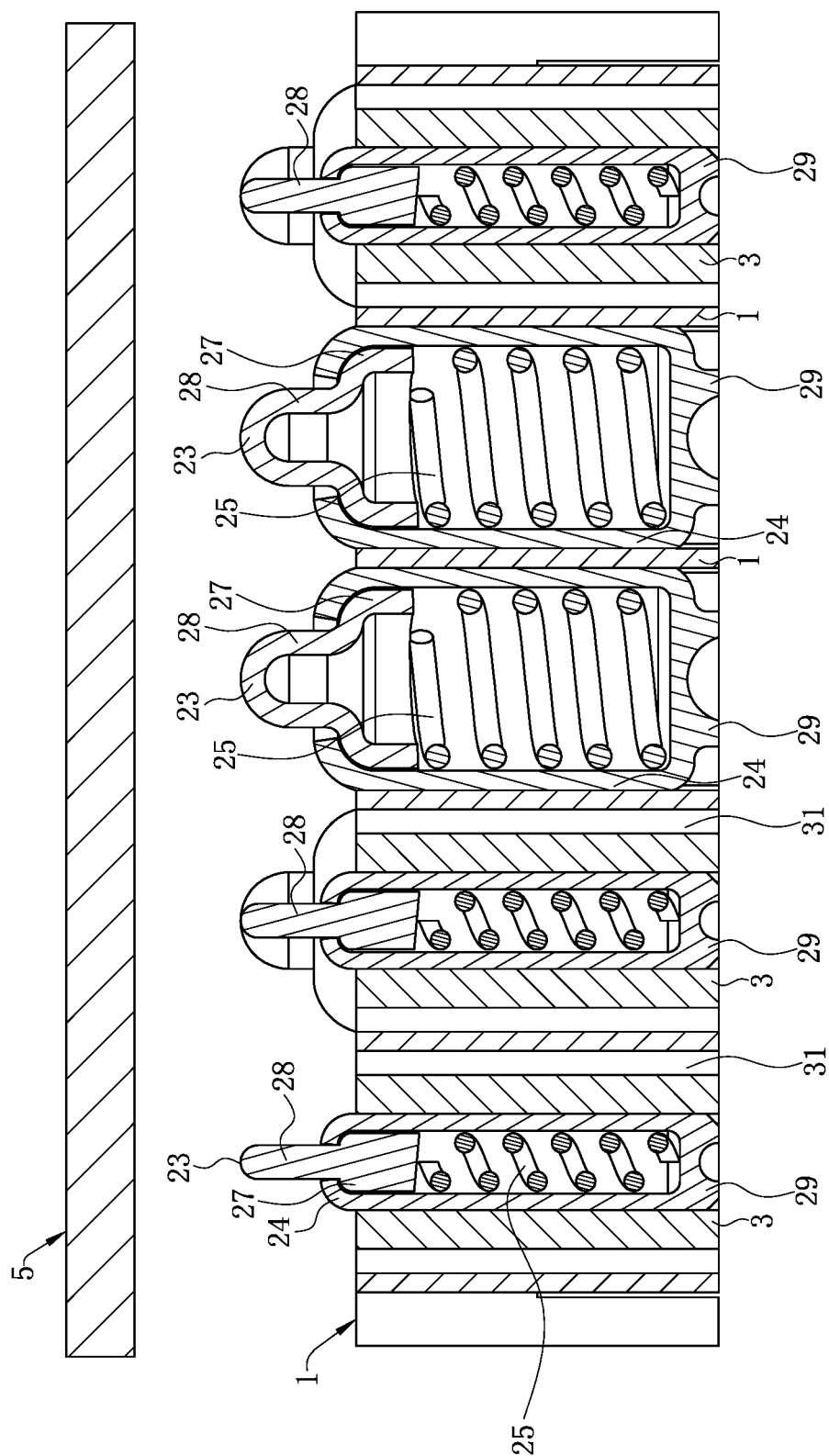
FIG. 8 is a sectional view of the electrical connector according to the third embodiment of the present invention.
Figure 9:
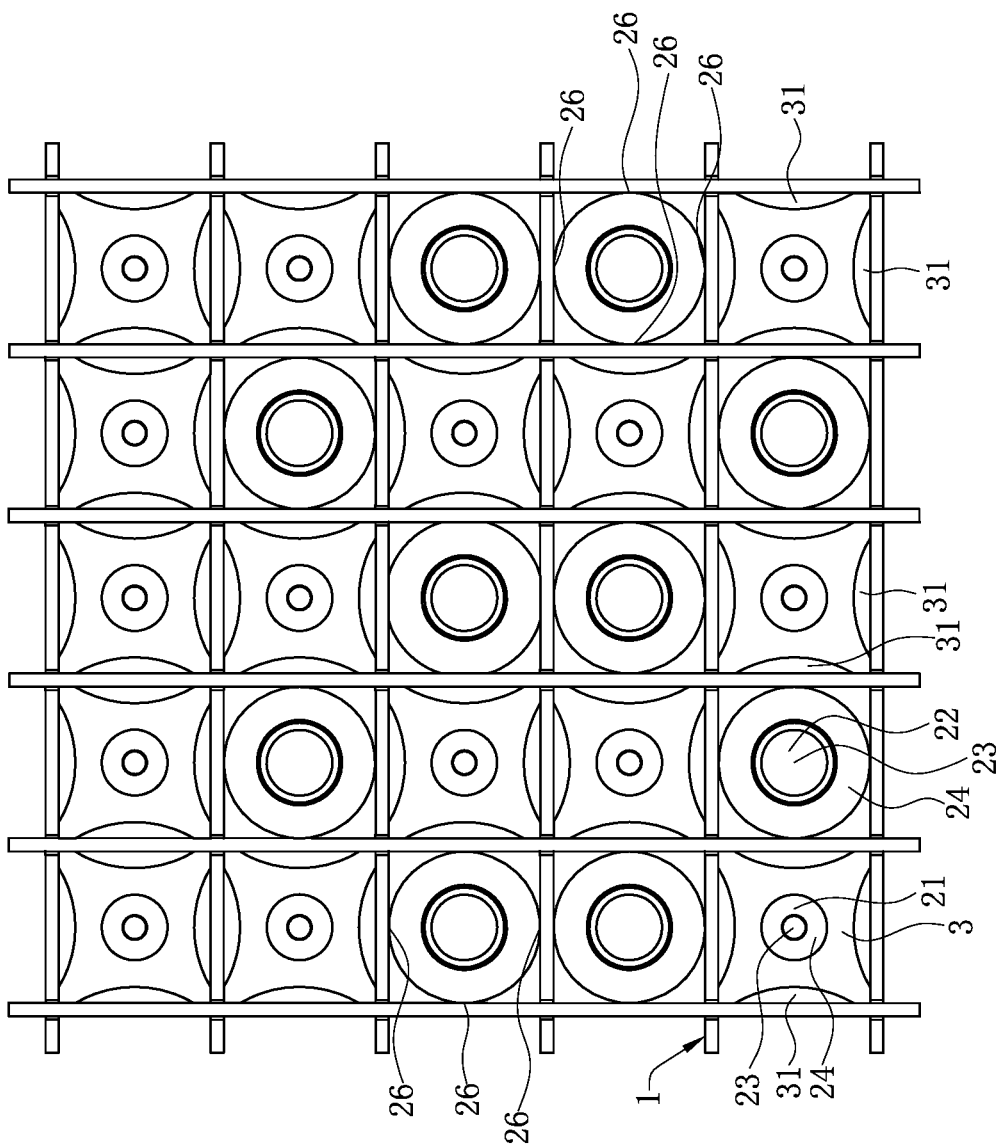
FIG. 9 is a top view of the electrical connector according to the third embodiment of the present invention.

FIG. 7 to FIG. 9 show an electrical connector 100 according to a third embodiment of the present invention, which is different from the first embodiment in that: the terminals 2 are in the form of pins, the sizes of the signal terminals 22 and the ground terminals 22 are not equal, and the mating portion 23, the elastic portion 25 and the positioning portion 24 are individually formed. The mating portion 23 is a hollow spherical cap. The elastic portion 25 is a screw spring. An extending portion 28 is formed by extending downward from the mating portion 23, and a stopping portion 27 is formed by extending downward from the extending portion 28. The extending portion 28 is a cylinder. The elastic portion 25 is a spring, which has better elasticity, further ensuring the mating portion 23 to stably abut the mating component 5. A bottom end of the stopping portion 27 is an oblique surface, which matches with the screw shape of the elastic portion 25, such that the stopping portion 27 does not deviate left-right when abutting an upper end of the elastic portion 25. The cross-section of the positioning portion 24 is circular. The stopping portion 27 and the elastic portion 25 are accommodated in the positioning portion 24. An abutting portion 29 integrally extends downward from the positioning portion 24, and the abutting portion 29 downward abuts the circuit board. A side surface of the stopping portion 27 protrudes out of a side surface of the extending portion 28. The elastic portion 25 upward abuts the stopping portion 27. The stopping portion 27 and the elastic portion 25 are accommodated in the positioning portion 24. The stopping portion 27 is stopped upward by the positioning portion 24, and the extending portion 28 extends out of the positioning portion 24.

As shown in FIG. 7 to FIG. 9, although the terminals 2 are individually formed, the side surface of the stopping portion 27, which extends downward from the mating portion 23, protrudes out of a side surface of the extending portion 28, and the stopping portion 27 is stopped upward by the positioning portion 24. Thus, the stopping portion 27 is not detached from the positioning portion 24. Further, the elastic portion 25 is accommodated in the positioning portion 24 as a whole and upward abuts the stopping portion 27, and the terminal 2 is structurally stable as a whole. Moreover, when the mating component 5 downward abuts the mating portion 23, the stopping portion downward abuts the elastic portion 25, and the elastic portion 25 is elastically pressed vertically, such that the mating portion 23 has a floating stroke, the stress of the mating component 5 to the terminal 2 does not integrate on the mating portion 23, and the terminal 2 is not easily damaged, facilitating prolonging the usage life of the electrical connector 100.

As shown in FIG. 7 to FIG. 9, no insulating block 3 is provided in each of the receiving holes 11 accommodating the ground terminals 22, and the ground terminals 22 are directly fixed in the receiving holes 11. The sizes of the receiving holes 11 are equal, and the size of each of the ground terminals 22 is greater than the size of each of the signal terminals 21. Viewing downward from top thereof, each receiving hole 11 is in a square shape, and the positioning portion 24 has four conductive portions 26 tangent to the corresponding receiving hole 11. The ground terminals 22 are directly conductively connected to the corresponding shielding member 1, ensuring stable and effective grounding. An insulating block 3 is provided between each signal terminal 21 and the corresponding shielding member 1 to be accommodated in a corresponding receiving hole 11, the signal terminal 21 is fixed in the insulating block 3, and the insulating block 3 is fixed in the corresponding receiving hole 11. Four corners of each of the insulating blocks 3 abut four corners of the corresponding receiving hole 11, and a buffer space 31 is provided between the insulating block 3 and the corresponding shielding member 1. When the corresponding shielding member 1 abuts the ground terminal 22, the buffer space 31 is reserved for the shielding member 1. Further, three signal terminals 21 are provided around each ground terminal 22. Thus, in the process of each ground terminal 22 being assembled and entering the corresponding receiving hole 11, the friction and pressing action of the ground terminal 22 to the shielding member 1 may be relieved in the buffer space 31. Moreover, the buffer space 31 is provided to facilitate the vertical floating of the signal terminals 21, which does not easily cause the deficiencies of empty soldering or missing soldering. The four corners of each insulating block 3 abut the four corners of the corresponding receiving hole 11, such that the insulating block 3 does not easily deviate left-right. Other structures and functions of the present embodiment are identical to those of the first embodiment, and are thus not further elaborated herein.

Figure 10:
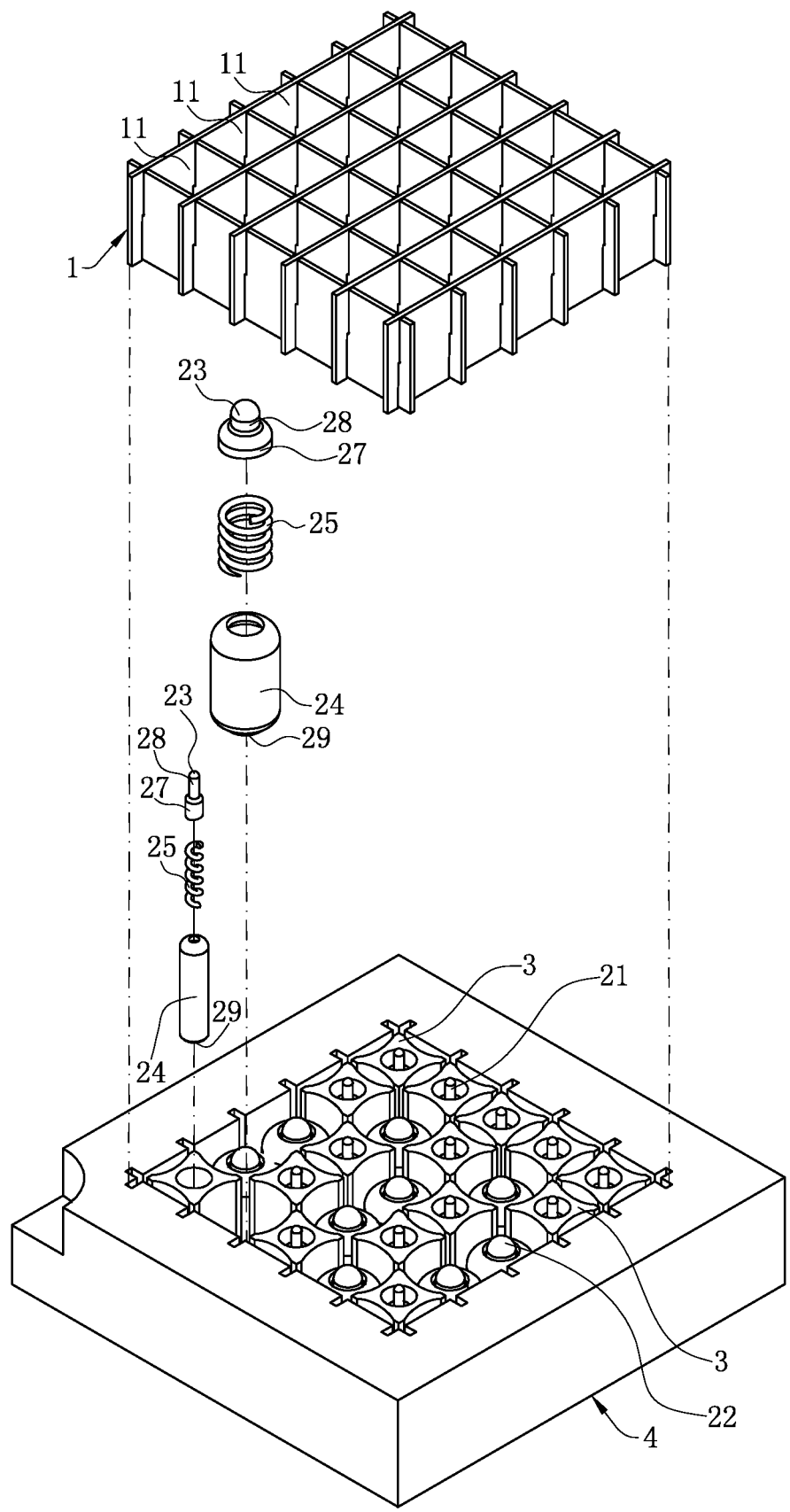
FIG. 10 is a partial exploded view of an electrical connector according to a fourth embodiment of the present invention.
Figure 11:
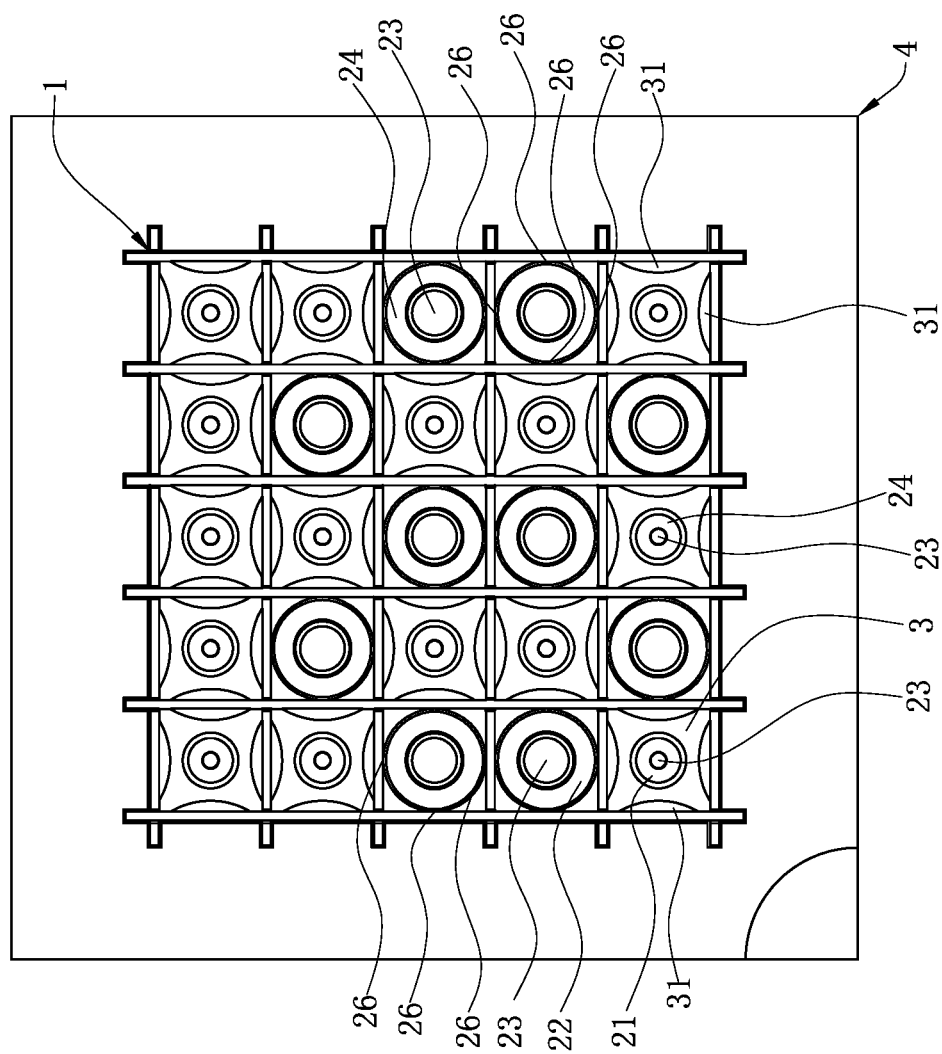
FIG. 11 is a top view of the electrical connector according to the fourth embodiment of the present invention.

FIG. 10 and FIG. 11 show an electrical connector 100 according to a fourth embodiment of the present invention, which is different from the third embodiment in that: after the shielding members 1 are perpendicularly engaged to one another, they are engaged with an insulating body 4, and the insulating blocks 3 in the receiving holes 11 accommodating the signal terminals 21 are all formed by extending upward from the insulating body 4, reducing the difficulties of forming and assembling. The insulating body 4 performs positioning to the shielding members 1, such that the shielding members 1 are more structurally stable, facilitating the terminals 2 to be stably fixed in the shielding members 1, ensuring good shielding effect, and achieving the high frequency requirement. Other structures and functions of the present embodiment are identical to those of the third embodiment, and are thus not further elaborated herein.

Figure 12:
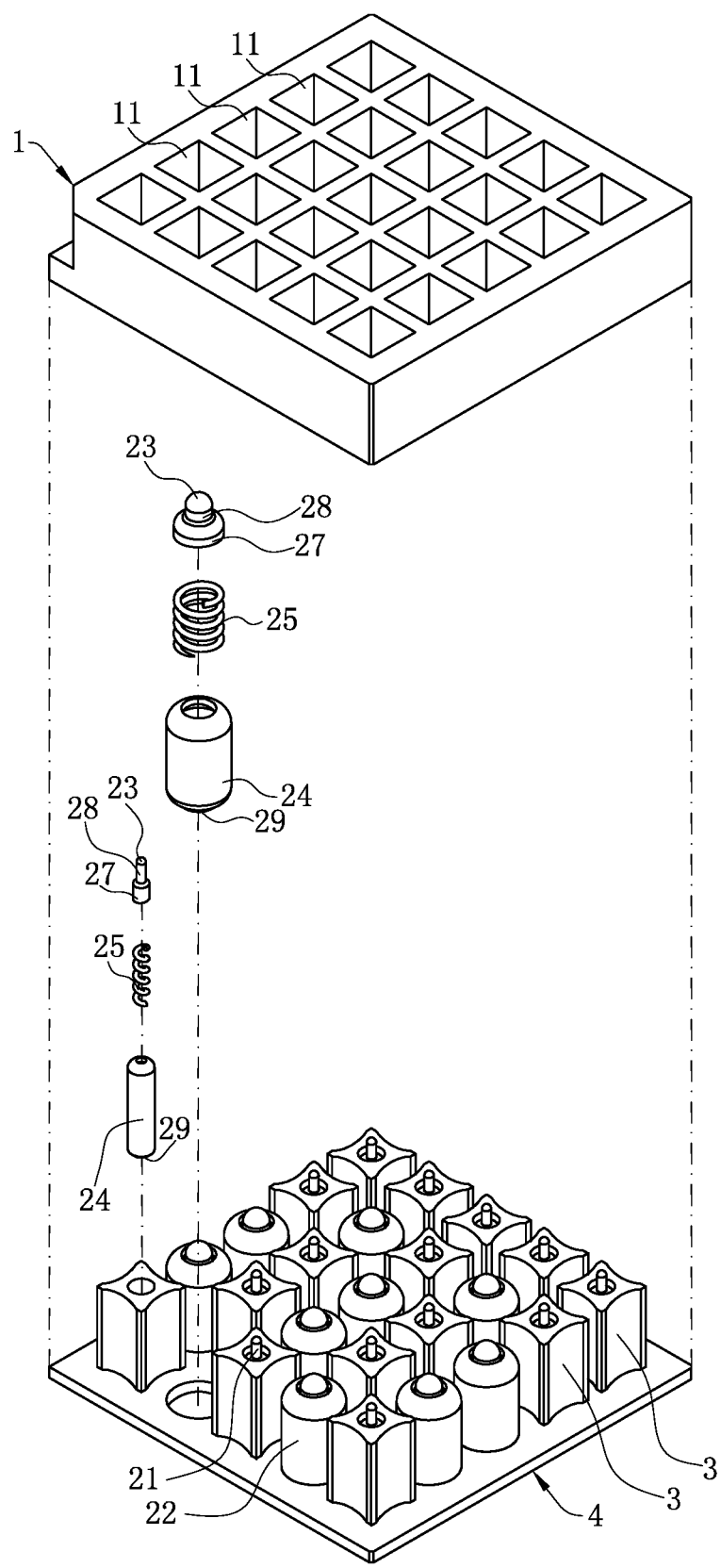
FIG. 12 is a partial exploded view of an electrical connector according to a fifth embodiment of the present invention.
Figure 13:
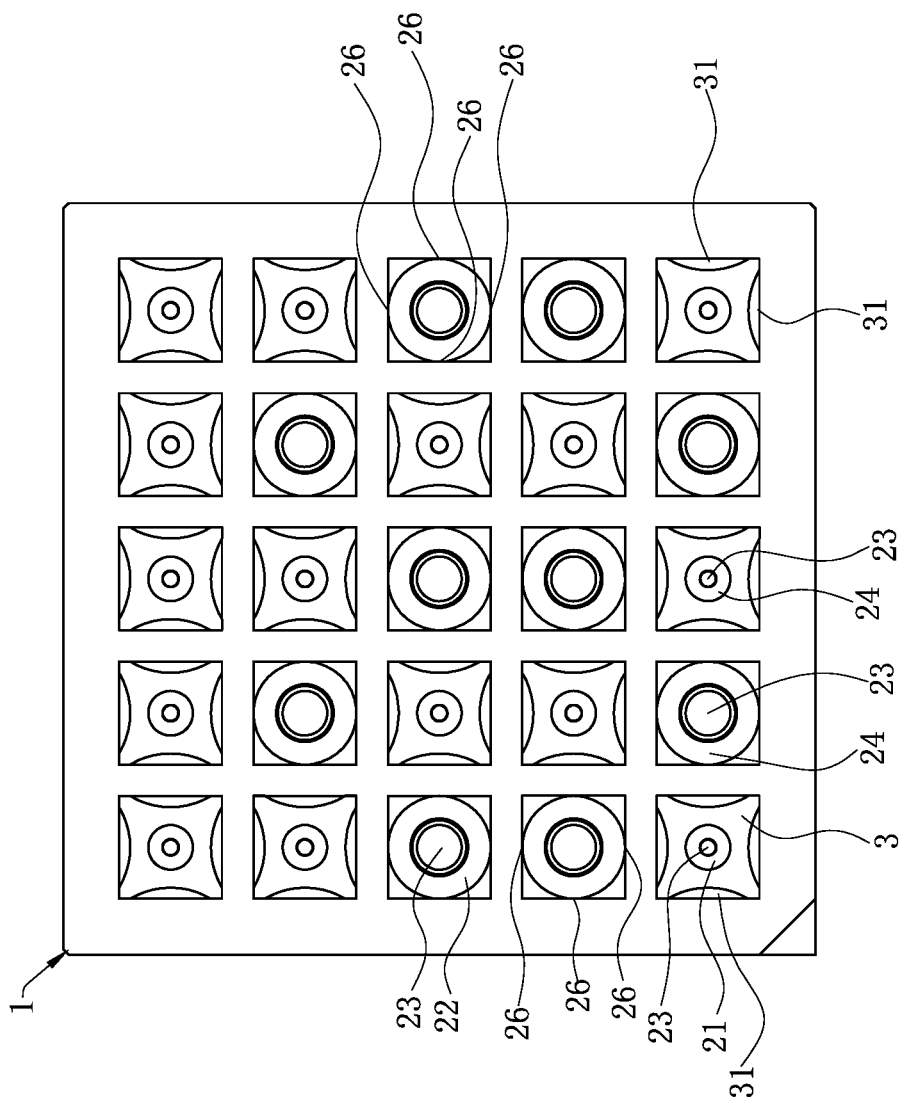
FIG. 13 is a top view of the electrical connector according to the fifth embodiment of the present invention.

FIG. 12 and FIG. 13 show an electrical connector 100 according to a fifth embodiment of the present invention, which is different from the third embodiment in that: the shielding member 1 is made of a wire grid type conductive plastic. The conductive plastic has light weight, good stretchability, elasticity and flexibility, is easy to form, and has good conductivity, thus ensuring good shielding effect. The shielding member 1 may also be made of other materials having shielding characteristics (such as filtering materials). The insulating body 4 is located below the shielding member 1, and the insulating blocks 3 in the receiving holes 11 accommodating the signal terminals 21 are all formed by extending upward from the insulating body 4. The insulating body 4 may also be located above the shielding member 1, and the insulating blocks 3 in the receiving holes 11 accommodating the signal terminals 21 are all formed by extending downward from the insulating body 4, thus reducing the difficulties of forming and assembling. The insulating blocks 3 are clamped and fixed to the receiving holes 11, such that the insulating body 4 has a retaining action to the shielding member 1, the shielding structure is more stable, ensuring good shielding effect, and achieving the high frequency requirement. Other structures and functions of the present embodiment are identical to those of the third embodiment, and are thus not further elaborated herein.

To sum up, certain embodiments of the present invention have the following beneficial effects:

1. On the premise that the volume of each receiving hole 11 remains unchanged, the positioning portion 24 being a cylinder may fully utilize the space therein compared to a positioning portion 24 being a flat plane structure, and may be provided with a larger area and having more paths for current transmission.

2. Three conductive portions 26 are provided between each ground terminal 22 and the corresponding shielding member 1, and the ground terminal 22 may be in stable contact with the three conductive portions 26. According to the rule that a circle can be determined by three points, the three conductive portions 26 may ensure the contour of the positioning portion 24 being a cylinder, and may ensure the diameter of the positioning portion 24. To better fix the terminal 2 such that it does not easily rock or deviate in a shaking environment, the insulating block 3 having a through hole 33 with a diameter equal to the diameter of the positioning portion 24 may be formed to fix the terminal 2, and the positioning portion 24 and the mating portion 23 are in more stable contact.

3. According to the "skin effect," the mating portion 23 is a hollow spherical cap, and the elastic portion 25 is a hollow cylinder, such that the current may integrate on the surfaces of the mating portion 23 and the elastic portion 25, greatly reducing the loss in the current transmission process, and facilitating the transmission of high frequency currents.

4. An insulating block 3 is provided between each signal terminal 21 and the corresponding shielding member 1 to be accommodated in a corresponding receiving hole 11. Four corners of each of the insulating blocks 3 abut four corners of the corresponding receiving hole 11, and a buffer space 31 is provided between the insulating block 3 and the corresponding shielding member 1. When the corresponding shielding member 1 abuts the ground terminal 22, the buffer space 31 is reserved for the shielding member 1. Further, three signal terminals 21 are provided around each ground terminal 22. Thus, in the process of each ground terminal 22 being assembled and entering the corresponding receiving hole 11, the friction and pressing action of the ground terminal 22 to the shielding member 1 may be relieved in the buffer space 31. Moreover, the buffer space 31 is provided to facilitate the vertical floating of the signal terminals 21, which does not easily cause the deficiencies of empty soldering or missing soldering. The four corners of each insulating block 3 abut the four corners of the corresponding receiving hole 11, such that the insulating block 3 does not easily deviate left-right.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector, configured to be electrically connected to a mating component, the electrical connector comprising:
one or more shielding members, forming a plurality of receiving holes; and
a plurality of terminals, comprising at least one signal terminal and at least one ground terminal, correspondingly accommodated in the receiving holes, the ground terminal has a mating portion configured to upward abut the mating component, an elastic portion pressed vertically to elastically deform, and a positioning portion having a circular cross-section, the positioning portion and the one or more shielding members are conductively connected to each other by at least three conductive portions, and the three conductive portions are provided to form a triangle.

2. The electrical connector according to claim 1, wherein viewing downward from top thereof, each of the receiving holes is in a square shape, and the at least three conductive portions comprise four conductive portions provided on the positioning portion and tangent to a corresponding one of the receiving holes.

3. The electrical connector according to claim 1, wherein the at least three conductive portions and the one or more shielding members are individually formed from the ground terminal, each of the at least three conductive portions has a main body portion and a first contact portion and a second contact portion extending from two ends of the main body portion, the first contact portion abuts the one or more shielding members, the second contact portion abuts the positioning portion, and each of the first contact portion and the second contact portion is provided to form an included angle with the main body portion.

4. The electrical connector according to claim 3, wherein the first contact portion is soldered to an inner wall of the corresponding one of the receiving holes, the main body portion is formed by extending downward from the first contact portion, and the second contact portion is formed by extending downward from the main body portion.

5. The electrical connector according to claim 1, wherein an insulating block is provided between the ground terminal and a corresponding shielding member of the one or more shielding members to be accommodated in a corresponding one of the receiving holes, the insulating block is provided with an accommodating space for one of the at least three conductive portions to enter, the mating portion is a hollow spherical cap, the elastic portion is a cylinder and is formed by extending downward from a bottom surface of the mating portion, a diameter of the bottom surface of the mating portion is greater than a diameter of the elastic portion, the bottom surface of the mating portion is downward stopped by the insulating block, and the positioning portion is formed by extending downward from the elastic portion.

6. The electrical connector according to claim 5, wherein the mating portion, the elastic portion and the positioning portion are all hollow, a side surface of the elastic portion has a screw-shaped notch, the positioning portion is a cylinder having a diameter equal to the diameter of the elastic portion, and a center of the elastic portion, a center of the mating portion and a center of the positioning portion are aligned in a vertical direction.

7. The electrical connector according to claim 1, wherein the mating portion, the elastic portion and the positioning portion are individually formed, the mating portion is a hollow spherical cap, the elastic portion is a screw spring, an extending portion is formed by extending downward from the mating portion, a stopping portion is formed by extending downward from the extending portion, the extending portion is a cylinder, a side surface of the stopping portion protrudes out of a side surface of the extending portion, the elastic portion upward abuts the stopping portion, the stopping portion and the elastic portion are accommodated in the positioning portion, the stopping portion is stopped upward by the positioning portion, and the extending portion extends out of the positioning portion.

8. The electrical connector according to claim 1, wherein an insulating block is provided between the signal terminal and a corresponding shielding member of the one or more shielding members to be accommodated in a corresponding one of the receiving holes, a buffer space is provided between the insulating block and the corresponding shielding member, and when the corresponding shielding member abuts the ground terminal, the buffer space is reserved for the corresponding shielding member.

9. The electrical connector according to claim 1, comprising a plurality of shielding members and further comprising an insulating body, wherein an insulating block is provided between the signal terminal and one of the shielding members to be accommodated in a corresponding one of the receiving holes, the insulating block is formed by extending upward from the insulating body, the shielding members are engaged perpendicularly to one another to form the receiving holes, and the shielding members are engaged to the insulating body.

10. The electrical connector according to claim 1, wherein an insulating block is provided between the signal terminal and a corresponding shielding member of the one or more shielding members to be accommodated in a corresponding one of the receiving holes, an insulating body is located below the one or more shielding members, the insulating block is formed by extending upward from the insulating body, and each of the one or more shielding members is made of an electrically conductive plastic.

11. An electrical connector, configured to be electrically connected to a mating component, the electrical connector comprising:
one or more shielding members, forming a plurality of receiving holes; and
a plurality of terminals, comprising at least one signal terminal and at least one ground terminal, correspondingly accommodated in the receiving holes, the ground terminal has a mating portion having a circular cross-section configured to upward abut the mating component, an elastic portion pressed vertically to elastically deform, and a positioning portion having a circular cross-section, the positioning portion and the one or more shielding members are conductively connected to each other by at least one conductive portion, and an insulating block is provided between the signal terminal and a corresponding shielding member of the one or more shielding members to be accommodated in a corresponding one of the receiving holes.

12. The electrical connector according to claim 11, wherein viewing downward from top thereof, each of the receiving holes is in a square shape, and at least three conductive portions comprise four conductive portions provided on the positioning portion and tangent to the corresponding one of the receiving holes.

13. The electrical connector according to claim 12, wherein four corners of the insulating block abut four corners of the corresponding one of the receiving holes, and a buffer space is provided between a side surface between two adjacent ones of the four corners of the insulating block and the adjacent corresponding shielding member.

14. The electrical connector according to claim 11, wherein the at least one conductive portion and the one or more shielding members are individually formed from the ground terminal, each of the at least one conductive portion has a main body portion and a first contact portion and a second contact portion extending from two ends of the main body portion, the first contact portion abuts the one or more shielding members, the second contact portion abuts the positioning portion, and each of the first contact portion and the second contact portion is provided to form an included angle with the main body portion.

15. The electrical connector according to claim 14, wherein the first contact portion is soldered to an inner wall of the corresponding one of the receiving holes, the main body portion is formed by extending downward from the first contact portion, and the second contact portion is formed by extending downward from the main body portion.

16. The electrical connector according to claim 11, wherein another insulating block is provided between the ground terminal and the corresponding shielding member of the one or more shielding members to be accommodated in another corresponding one of the receiving holes, the insulating block between the ground terminal and the corresponding shielding member is provided with an accommodating space for one of the at least one conductive portion to enter, the mating portion is a hollow spherical cap, the elastic portion is a cylinder with a side surface having a plurality of notches and is formed by extending downward from a bottom surface of the mating portion, a diameter of the bottom surface of the mating portion is greater than a diameter of the elastic portion, the bottom surface of the mating portion is downward stopped by the insulating block between the ground terminal and the corresponding shielding member, and the positioning portion is formed by extending downward from the elastic portion.

17. The electrical connector according to claim 11, wherein the mating portion, the elastic portion and the positioning portion are individually formed, the mating portion is a hollow spherical cap, the elastic portion is a screw spring, an extending portion is formed by extending downward from the mating portion, a stopping portion is formed by extending downward from the extending portion, the extending portion is a cylinder, a side surface of the stopping portion protrudes out of a side surface of the extending portion, the elastic portion upward abuts the stopping portion, the stopping portion and the elastic portion are accommodated in the positioning portion, the stopping portion is stopped upward by the positioning portion, and the extending portion extends out of the positioning portion.

18. The electrical connector according to claim 11, comprising a plurality of shielding members and further comprising an insulating body, wherein the insulating block is formed by extending upward from the insulating body, the shielding members are engaged perpendicularly to one another to form the receiving holes, and the shielding members are engaged to the insulating body.

19. The electrical connector according to claim 11, further comprising an insulating body located below the one or more shielding members, wherein the insulating block is formed by extending upward from the insulating body, and each of the one or more shielding members is made of an electrically conductive plastic.

20. The electrical connector according to claim 11, wherein the positioning portion and the one or more shielding members are conductively connected to each other by at least three conductive portions, and the three conductive portions are provided to form a triangle.

\* \* \* \* \*